United States Patent
Kotecki et al.

(10) Patent No.: US 6,268,259 B1
(45) Date of Patent: Jul. 31, 2001

(54) OVERHANGING SEPARATOR FOR SELF-DEFINING STACKED CAPACITOR

(75) Inventors: David E. Kotecki, Hopewell Junction; William H. Ma, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/103,187

(22) Filed: Jun. 23, 1998

Related U.S. Application Data

(62) Division of application No. 08/865,533, filed on May 29, 1997, now Pat. No. 5,796,573.

(51) Int. Cl.⁷ .................................................. H01L 21/20
(52) U.S. Cl. ............................................... 438/396; 438/5
(58) Field of Search .............................. 438/5, 240, 253, 438/254, 396, 397

(56) References Cited

U.S. PATENT DOCUMENTS

| | | | |
|---|---|---|---|
| 5,098,853 | * 3/1992 | Clark et al. | 438/320 |
| 5,143,861 | 9/1992 | Turner | 437/52 |
| 5,272,103 | * 12/1993 | Nakamura | 438/253 |
| 5,335,138 | 8/1994 | Sandhu et al. | 361/303 |
| 5,346,844 | 9/1994 | Cho et al. | 438/253 |
| 5,381,302 | 1/1995 | Sandhu et al. | 361/305 |
| 5,392,189 | 2/1995 | Fazan et al. | 361/305 |
| 5,416,042 | 5/1995 | Beach et al. | 437/60 |
| 5,418,180 | 5/1995 | Brown et al. | 437/60 |
| 5,436,477 | 7/1995 | Hashizume et al. | 257/310 |
| 5,478,772 | 12/1995 | Fazan et al. | 437/60 |
| 5,489,548 | 2/1996 | Nishioka et al. | 437/60 |
| 5,504,041 | 4/1996 | Summerfelt | 437/235 |
| 5,506,166 | 4/1996 | Sandhu et al. | 437/60 |
| 5,534,458 | 7/1996 | Okudaira et al. | 437/52 |
| 5,550,076 | 8/1996 | Chen et al. | 437/52 |
| 5,554,564 | 9/1996 | Nishioka et al. | 437/192 |
| 5,654,236 | * 8/1997 | Kasai | 438/639 |

* cited by examiner

Primary Examiner—Stephen D. Meier
Assistant Examiner—Jeff Vockrodt
(74) Attorney, Agent, or Firm—Alison D. Mortinger; Jay H. Anderson

(57) ABSTRACT

An overhanging separator structure with a post projecting from a surface which may be a substrate, an underlying layer on the surface, and a separator layer on the underlying layer, with the separator layer overhanging the underlying layer. A discontinuous film is then formed in a single process step having a first portion on the separator layer and a second portion on the post, the discontinuity caused by the overhanging separator layer. The structure is made into a stacked capacitor with the second (post) portion of the discontinuous film being the bottom electrode, by forming a continuous dielectric layer on the bottom electrode and a continuous top electrode layer on the dielectric layer.

26 Claims, 5 Drawing Sheets

OVERHANGING SEPARATOR FOR SELF-DEFINING STACKED CAPACITOR

RELATED APPLICATIONS

This application is a divisional of application Ser. No. 08/865,533 now U.S. Pat. No. 5,796,573 filed May 29, 1997.

This invention is related to copending U.S. patent applications Ser. No. 08/865,528, now U.S. Pat. No. 6,153,491, titled "Overhanging Separator for Self-Defining Discontinuous Film," Ser. No. 08/865,534, now U.S. Pat. No. 6,002,575, titled "Adherent Separator for Self-Defining Discontinuous Film", and Ser. No. 08/865,529, now U.S. Pat. No. 5,955,756, titled "Trench Separator for Self-Defining Discontinuous Film", all filed on the same day and assigned to the present assignee.

FIELD OF THE INVENTION

This invention is directed to semiconductor films and the manufacture of the same, more particularly to a self-defining discontinuous film, and most particularly to a capacitor employing a self-defining bottom electrode.

BACKGROUND OF THE INVENTION

Stacked capacitor structures using high-dielectric materials such as $(Ba,Sr)TiO_3$ (BST) require noble metal electrodes, such as platinum, which are very difficult to pattern using conventional semiconductor processing such as reactive ion etching (RIE), ion beam etching, or chemical-mechanical polishing (CMP). Therefore there is a need for a capacitor structure which does not require a separate patterning step to define the electrodes.

For purposes of this invention, the term "oxide" layer is used generally to refer to a layer of silicon dioxide, and the silicon dioxide may be undoped or doped, for example, with boron, phosphorous, or both, to form for example borophosphosilicate glass (BPSG), and phosphosilicate glass (PSG). The silicon dioxide layers may be grown or deposited by conventional techniques.

SUMMARY OF THE INVENTION

It is therefore an object of the present invention to provide a capacitor structure which does not require a separate patterning step to define the electrodes.

It is a further object to provide a structure which is useful for forming a discontinuous film in one process step.

It is a further object to provide such a structure which is feasible for routine manufacturing.

In accordance with the above listed and other objects, an overhanging separator structure is provided with a post projecting from a surface which may be a substrate, an underlying layer on the surface, the underlying layer having a first opening formed therein such that the post is within the first opening and at least a first distance from the underlying layer, and a separator layer on the underlying layer, the separator layer having a second opening formed therein such that the post is within the second opening and at least a second distance from the separator layer, the separator layer overhanging the underlying layer. A non-patterned discontinuous film can then be formed having a first portion on the separator layer and a second portion on the post, the discontinuity substantially in register with the second opening.

The structure is made into a stacked capacitor with the second (post) portion of the discontinuous film being the bottom electrode, by forming a dielectric layer on the bottom electrode and a continuous top electrode layer on the dielectric layer.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of a stacked capacitor merely as a specific example, and is not meant to limit applicability of the invention to such. Those skilled in the art will understand that the invention is broadly applicable to any structure or method in which it is desirable to have a self-defining discontinuous film structure with a post projecting from a surface, an underlying layer on the surface, the underlying layer having a first opening formed therein such that the post is within the first opening and at least a first distance from the underlying layer, and a separator layer on the underlying layer, the separator layer having a second opening formed therein such that the post is within the second opening and at least a second distance from the separator layer, the separator layer overhanging the underlying layer. A non-patterned discontinuous film may then be formed having a first portion on the separator layer and a second portion on the post, the discontinuity substantially in register with the second opening.

Figure 1A:
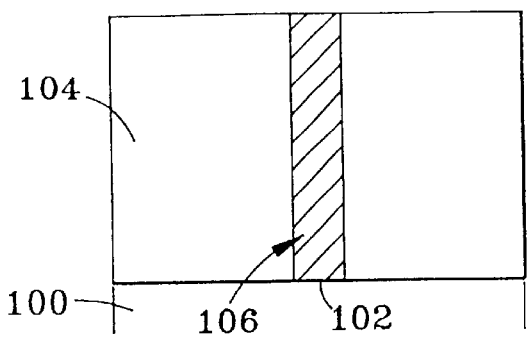
FIGS. 1a–1n are sectional views of the processing steps to manufacture the capacitor structure.
Figure 1B:
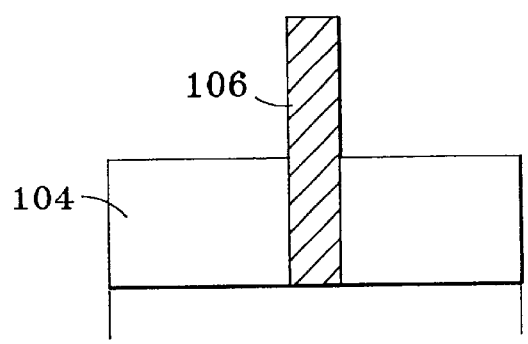

In FIG. 1a, a substrate 100 with a contact region 102 has formed thereon a layer of oxide 104. Note that for certain applications of the capacitor structure to be formed, other circuit elements such as word line and bit line contacts may be fabricated prior to and below the capacitor, within substrate 100 or oxide 104. Oxide 104 has been patterned by forming a hole extending down to contact region 102. A conductive material, for example in-situ doped polysilicon, tungsten, titanium, or various silicides including tungsten and titanium silicides, was then deposited for example by low pressure chemical vapor deposition (LPCVD) or sputtering followed by planarization to form post 106. Oxide 104 is then recessed so that post 106 is projecting from oxide 104 as shown in FIG. 1b. Note that post 106 may or may not have a portion below the oxide surface; both are within the scope of the term "projecting from." For structural strength, it is preferable to have a portion below the surface.

Figure 1C:
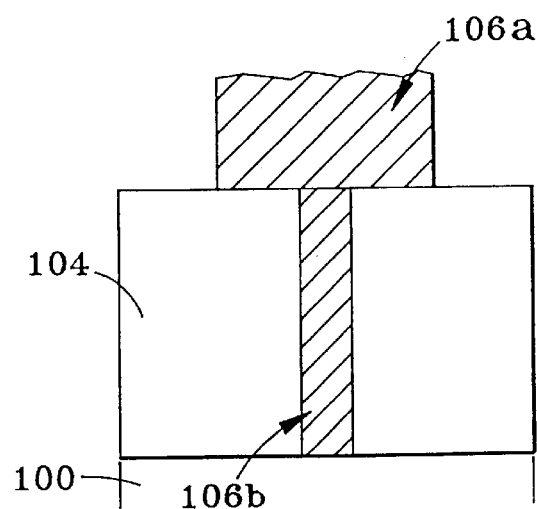

Alternatively, post 106 can be formed of more than one material in a multi-stage deposition process, resulting in an exemplary structure shown in FIG. 1c with a first portion 106a below the oxide surface and a second portion 106b on top of the first.

Figure 1D:
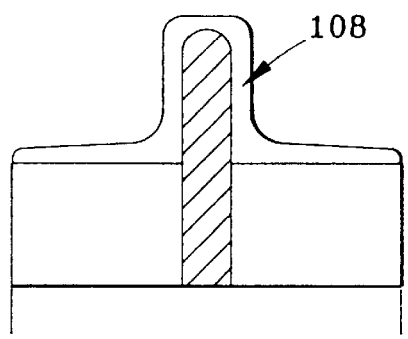
Figure 1E:
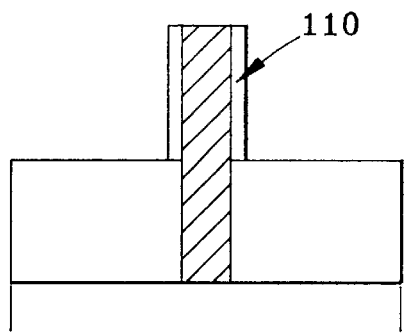
Figure 1F:
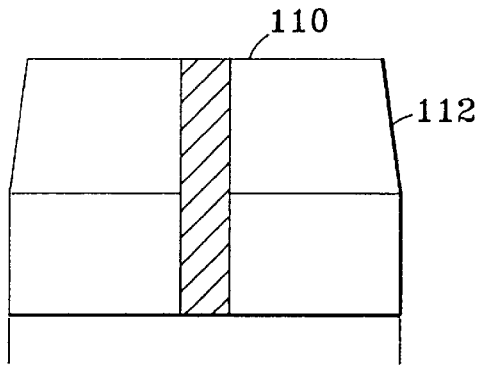
Figure 1G:
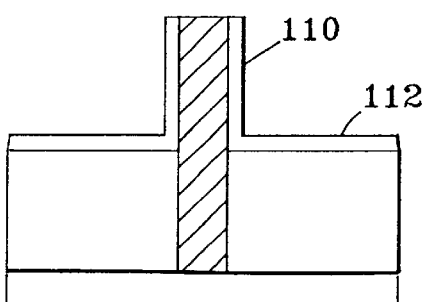
Figure 1H:
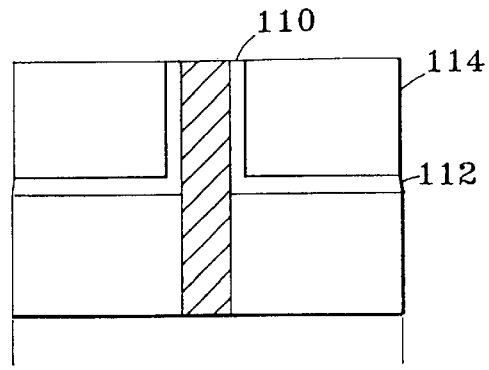
Figure 1I:
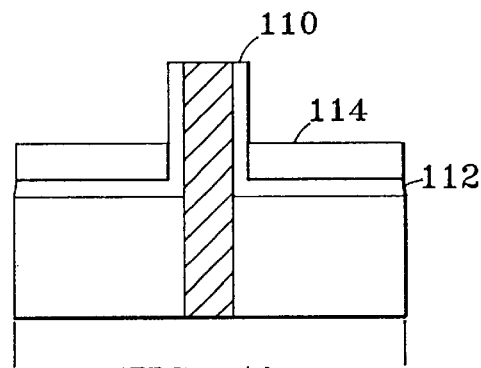
Figure 1J:
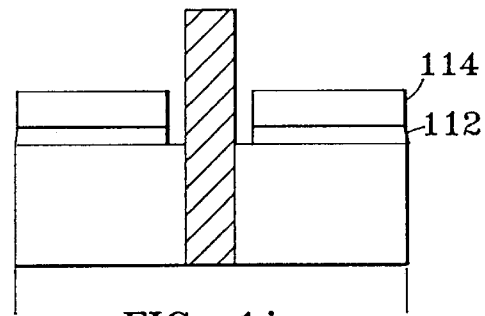
Figure 1K:
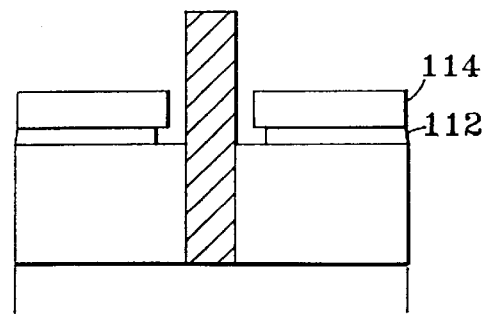

In FIG. 1d, a disposable layer 108 is formed over post 106 and oxide 104 and patterned for example by reactive ion etching (RIE) to form a disposable sidewall spacer 110 in FIG. 1e. Underlying layer 112 is then deposited and planarized as shown in FIG. 1f, and etched back in FIG. 1g. Separator layer 114 is deposited and planarized in FIG. 1h, and also etched back in FIG. 1i. Disposable sidewall spacer 110 is then removed in FIG. 1j by a selective process, either wet or dry, and in FIG. 1k underlying layer 112 is recessed with respect to separator layer 114 for example by a selective wet etch.

Disposable layer 108 may be formed from any material that is selectively removable with respect to underlying layer 112, separator layer 114, and post 106. Underlying layer 112 may be formed from any material which is selectively etchable with respect to separator layer 114 and post 106. For example, disposable layer 108 may be an oxide or a nitride, with an underlying layer 112 and separator layer 114 of nitride, oxide, polysilicon, or polyimide.

With overhanging separator 114 complete, formation of the stacked capacitor can begin as shown in FIG. 11. A bottom electrode layer 116 is deposited in a single process step for example by a sputter process or CVD, which can be made more directional for example by collimation. Bottom electrode 116 may be for example Pt, Ir, Pd, or $IrO_2$ and is preferably a noble metal or noble metal oxide for high dielectric constant capacitor applications. It is important to note that bottom electrode layer 116 is discontinuous, and that the discontinuity is caused by separator 114. Layer 116 can also be characterized as non-patterned, or discontinuous-as-deposited. Therefore adjacent capacitors are prevented from shorting together. Thus the bottom electrode is self-forming or self-defining.

Figure 1L:
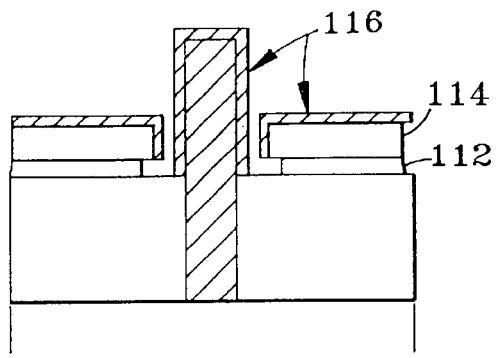
Figure 1M:
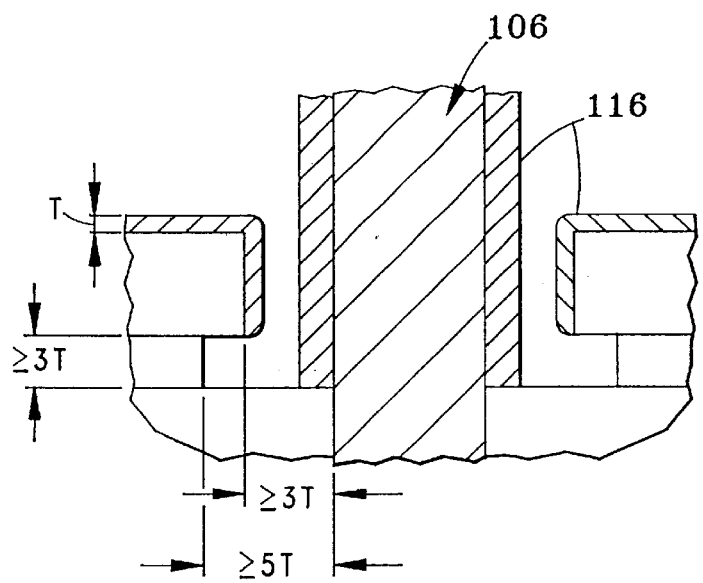

Optimally, with a non-directional deposition process for layer 116, separator 114 is a distance away from post 106 greater than or equal to three times the thickness T of layer 116. Underlying layer 112 is a distance away from post 106 greater than or equal to 5T, i.e. separator 114 overhangs underlying layer 112 by about 2T. Underlying layer 112 optimally has a thickness greater than or equal to 3T. This relationship is shown in FIG. 1m. The use of a more directional deposition process for layer 116 will enable less restrictive dimensions, i.e. less of an overhang and a thinner underlying layer, for example half the directional dimensions.

Figure 1N:
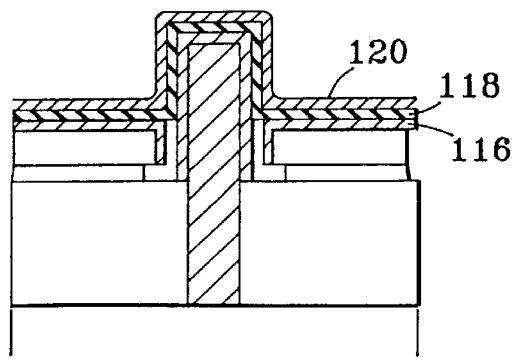

The capacitor is completed in FIG. 1n by depositing a dielectric layer 118 followed by a top electrode layer 120. Layers 118 and 120 are deposited by sputtering or CVD, for example. Dielectric 120 is any suitable capacitor dielectric, and is preferably a high-dielectric constant material (i.e. with a dielectric constant over 20) such as $(Ba,Sr)TiO_3$ (BST). Top electrode 120 is preferably from the same group of materials as bottom electrode 116.

Figure 2D:
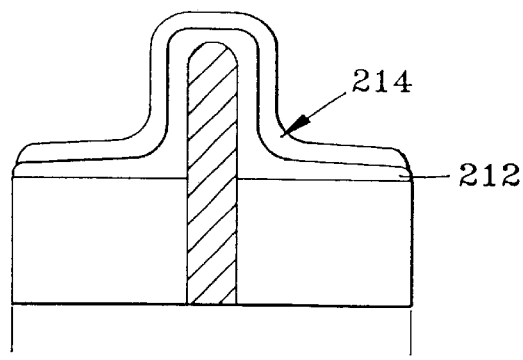
FIGS. 2d–2h are sectional views of alternate steps to those shown in FIGS. 1d–1k, all in accordance with the present invention.
Figure 2G:
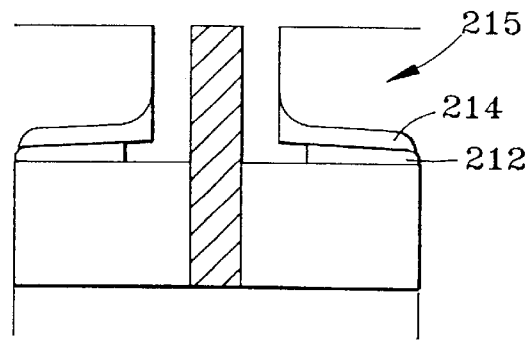
Figure 2E:
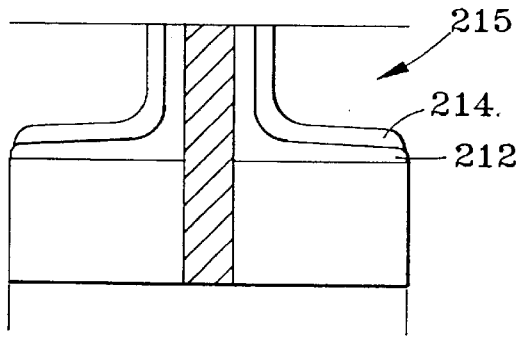
Figure 2H:
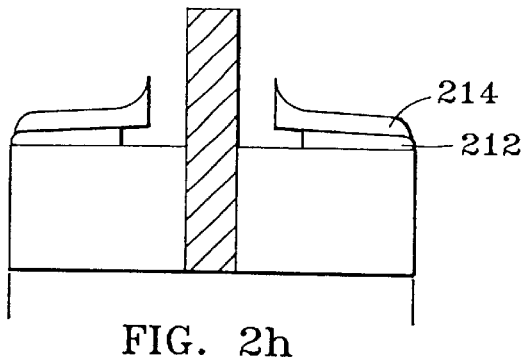
Figure 2F:
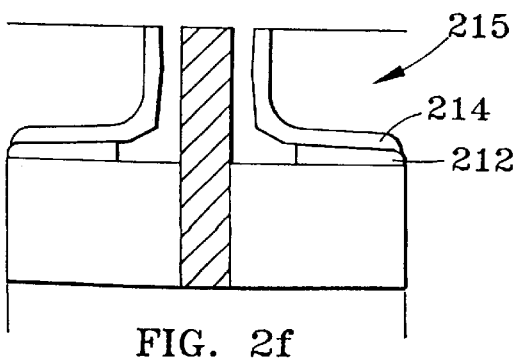

An alternate method to that shown in FIGS. 1d–1k of forming the underlying and separator layers is shown in FIGS. 2d–2h. In FIG. 2d, conformal underlying layer 212 and conformal overhanging layer 214 are sequentially deposited for example by chemical vapor deposition (CVD). A disposable material 215 is then deposited and the resulting structure is planarized as shown in FIG. 2e. In FIG. 2f, underlying layer 212 is etched by a suitable selective process, either wet or dry, followed by a similar selective etching of overhanging layer 214 in FIG. 2g. Layers 212 and 214 could be etched in the same step if they are made of materials which can be etched using a etchant with a suitable selectivity ratio. Disposable layer 215 is then removed, resulting in the structure shown in FIG. 2h. Creation of the discontinuous film and stacked capacitor follows as shown in FIGS. 1l–1n.

In summary, a capacitor structure is provided which does not require a separate patterning step to define the bottom electrode. More generally, a structure is provided which is useful for forming a discontinuous film in one process step, and is thus feasible for routine semiconductor manufacturing.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of making an overhanging separator structure useful for creating a self-defining discontinuous film, comprising the steps of:

forming a post projecting from a surface; and forming an underlying layer on the surface, the underlying layer having a first opening formed therein such that the post is within the first opening and at least a first distance from the underlying layer; and forming a separator layer on the underlying layer, the separator layer having a second opening formed therein such that the post is within the second opening and at least a second distance from the separator layer, the separator layer overhanging the underlying layer; and forming in one process step a discontinuous film having a first portion on the separator layer and a second portion on the post, the discontinuity substantially in register with the second opening.

2. The method of claim 1 wherein the structure is a capacitor, and the discontinuous film is a bottom electrode of the capacitor, further comprising the steps of;

forming a continuous dielectric layer on the bottom electrode; and forming a continuous top electrode layer on the dielectric layer.

3. The method of claim 2 wherein the bottom electrode is a material selected from the group consisting of noble metals and noble metal oxides.

4. The method of claim 3 wherein the bottom electrode is platinum.

5. The method of claim 2 wherein the dielectric layer is a high-dielectric constant material.

6. The method of claim 5 wherein the dielectric layer is $(Ba,Sr)TiO_3$.

7. The method of claim 1, wherein the post is formed of more than one material in a multi-stage deposition process.

8. The method of claim 1 wherein the post material is conductive.

9. The method of claim 8 wherein the post material is a material selected from the group consisting of in-situ doped polysilicon, tungsten, titanium, and a metal silicide.

10. The method of claim 1, wherein the underlying layer and overhanging layer are formed by:

forming a disposable sidewall on the post;

forming the underlying layer on the surface;

forming the overhanging layer on the underlying layer; removing the disposable sidewall; and recessing the underlying layer.

11. The method of claim 1, wherein the underlying layer and the overhanging layer are formed by:

forming a conformal underlying layer on the surface and post;

forming a conformal overhanging layer on the underlying layer;

forming a disposable layer on the overhanging layer; planarizing the disposable layer, overhanging layer, and underlying layer down to the post;

etching the underlying and overhanging layers; and removing the disposable layer.

12. The method of claim 11, wherein the underlying and overhanging layers are etched in the same step.

13. The method of claim 1 wherein the underlying layer is a material selected from the group consisting of oxide, nitride, polysilicon, and polyimide.

14. The method of claim 1 wherein the underlying layer is an oxide.

15. The method of claim 1 wherein the separator layer is a material selected from the group consisting of insulators and semiconductors.

16. The method of claim 15 wherein the separator layer is an insulator.

17. The method of claim 16 wherein the separator layer is an oxide.

18. The method of claim 16 wherein the separator layer is a nitride.

19. The method of claim 16 wherein the separator layer is a material selected from the group consisting of undoped $SiO_2$, doped $SiO_2$, SiN, and diamond-like carbon.

20. The method of claim 1 wherein the first distance is at least equal to 5 times the thickness of the discontinuous film.

21. The method of claim 1 wherein the underlying layer has a thickness at least equal to 3 times the thickness of the discontinuous film.

22. The method of claim 1 wherein the second distance is at least equal to 3 times the thickness of the discontinuous film.

23. The method of claim 1 wherein the discontinuous film is formed by a directional deposition process.

24. The method of claim 23 wherein the first distance is at least equal to 2.5 times a thickness of the discontinuous film.

25. The method of claim 23 wherein the underlying layer has a thickness at least equal to 1.5 times the thickness of the discontinuous film.

26. The method of claim 23 wherein the second distance is at least equal to 1.5 times the thickness of the discontinuous film.

* * * * *